United States Patent
Cho

(10) Patent No.: US 8,759,233 B2
(45) Date of Patent: Jun. 24, 2014

(54) METHOD FOR FABRICATING SEMICONDUCTOR DEVICE

(75) Inventor: Sang Hoon Cho, Gwacheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 93 days.

(21) Appl. No.: 13/529,133

(22) Filed: Jun. 21, 2012

(65) Prior Publication Data

US 2013/0157383 A1    Jun. 20, 2013

(30) Foreign Application Priority Data

Dec. 16, 2011    (KR) .................. 10-2011-0136654

(51) Int. Cl.
*H01L 21/31* (2006.01)
*H01L 21/469* (2006.01)

(52) U.S. Cl.
USPC .......... 438/779; 438/238; 438/381; 438/553; 438/738; 257/E21.006; 257/E21.102; 257/E21.115; 257/E21.129; 257/E21.231; 257/E21.257; 257/E21.277; 257/E21.319; 257/E21.577; 257/E21.585

(58) Field of Classification Search
USPC ............ 438/779, 553, 474, 238, 381, 3, 637, 438/700, 270, 738, 740, 758, 785, 685, 438/636; 257/E21.006, E21.102, E21.115, 257/E21.129, E21.22, E21.231, E21.257, 257/E21.277, E21.319, E21.577, E21.585
See application file for complete search history.

(56) References Cited

U.S. PATENT DOCUMENTS

| | | | |
|---|---|---|---|
| 6,396,735 B2 * | 5/2002 | Michijima et al. ............ | 365/173 |
| 7,088,610 B2 * | 8/2006 | Tai ................................ | 365/158 |
| 7,933,145 B2 * | 4/2011 | Yamagishi et al. ........... | 365/158 |
| 8,158,445 B2 * | 4/2012 | Ryu et al. ...................... | 438/3 |
| 8,294,131 B2 * | 10/2012 | Kim et al. ..................... | 257/2 |
| 8,334,148 B2 * | 12/2012 | Jeong et al. ................... | 438/3 |

* cited by examiner

*Primary Examiner* — David Nhu
(74) *Attorney, Agent, or Firm* — IP & T Group LLP

(57) ABSTRACT

A method for fabricating a semiconductor device includes forming a metal layer on a substrate, forming a plurality of layers of a magnetic tunnel junction (MTJ) element on the metal layer, forming a carbon layer including a hole, wherein the hole penetrates through the carbon layer, forming a metal pattern in the hole of the carbon layer, removing the carbon layer; and patterning the plurality of layers of the MTJ element using the metal pattern as an etching mask.

10 Claims, 4 Drawing Sheets

METHOD FOR FABRICATING SEMICONDUCTOR DEVICE

CROSS-REFERENCE(S) TO RELATED APPLICATIONS

The present application claims priority of Korean Patent Application No(s). 10-2011-0136654, filed on Dec. 16, 2011, which is incorporated herein by reference in its entirety.

BACKGROUND OF THE INVENTION

The present invention relates to a memory device, and more particularly to a memory device including a magnetic tunnel junction device.

A dynamic random access memory (DRAM), which is one of the most widely used semiconductor memory device, exhibits high operation speed and high integration. However, the DRAM is a volatile memory device and loses data upon power-off, and during operation, a refresh process is performed on the memory to prevent loss of stored data. Meanwhile, a flash memory is a non-volatile memory device and can be manufactured in high integration. However, the flash memory has a slow operation speed. As an alternative for the DRAM and the flash memory, a magneto-resistance random memory device (MRAM) has been developed and exhibits non-volatility, high operation speed, and high integration (scalability) characteristics.

More specifically, an MRAM device is a non-volatile memory device where data is stored in magnetic storage elements having a different resistance according to magnetic field changed between ferromagnetic plates. The magnetic storage element is a component including two ferromagnetic plates separated by an insulating layer. If polarities of the two ferromagnetic plates are parallel (the same), resistance of the magnetic storage element is minimized. Otherwise, if polarities of the two ferromagnetic plates are opposite, the resistance is maximized. The MRAM device stores data based on a change in resistance of a cell according to magnetization of ferromagnetic plates in the magnetic storage element. As a magnetic storage element, a Magnetic Tunnel Junction (MTJ ELEMENT) is widely used.

In an MRAM, a MTJ element generally includes a stacked structure of a ferromagnetic layer, an insulating layer, and another ferromagnetic layer. When electrons passing through a first ferromagnetic layer penetrate into an insulating layer serving as a tunneling barrier, electron's probability to penetrate into the insulating layer is determined by magnetic direction of second ferromagnetic layer. If two ferromagnetic layers have the same polarity (parallel magnetic direction), amount of current tunneling the insulating layer is maximized. Otherwise, if two ferromagnetic layers have opposite magnetic directions, amount of current is minimized. For example, when resistance recognized based on the tunneling current is high, information stored in the MTJ element is a logic level "1" (or "0"). If the resistance is low, information is a logic level "0" (or "1"). Hereinafter, one of two ferromagnetic layers is called a pinned layer because its polarity is fixed to a certain polarity, but the other is called a free layer because its polarity can be changed according to an applied magnetic field or current.

Here, manufacturing an MRAM device may be difficult. For instance, a microstructure of a ferromagnetic layer and an insulating layer for a MRAM device may be difficult to fabricate. Further, semiconductor process machines may not be advanced enough to pattern layers of a ferromagnetic layer and an insulating layer.

SUMMARY OF THE INVENTION

An embodiment of the present invention is directed to a method for fabricating a semiconductor device in which process reliability can be raised.

In accordance with an embodiment of the present invention, a method for fabricating a semiconductor device includes forming a metal layer on a substrate, forming a plurality of layers of a magnetic tunnel junction (MTJ) element on the metal layer, forming a carbon layer including a hole, wherein the hole penetrates through the carbon layer, removing the carbon layer; and patterning the plurality of layers of the MTJ element using the metal pattern as an etching mask.

In accordance with an embodiment of the present invention, a method for fabricating a semiconductor device includes forming a magnetic tunnel junction (MTJ) element, forming a carbon layer over the MTJ element, wherein the carbon layer includes a hole, and filling a metal in the hole.

DESCRIPTION OF SPECIFIC EMBODIMENTS

Figure 1A:
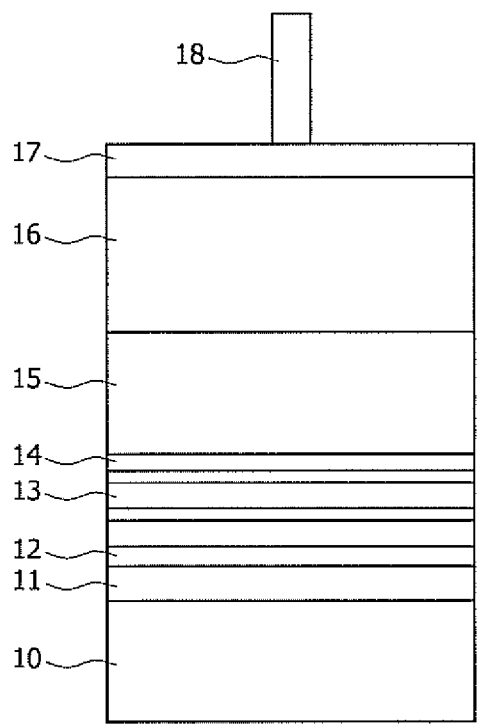
FIGS. 1A to 1B illustrate sectional views representing a method for fabricating a semiconductor device.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1B:
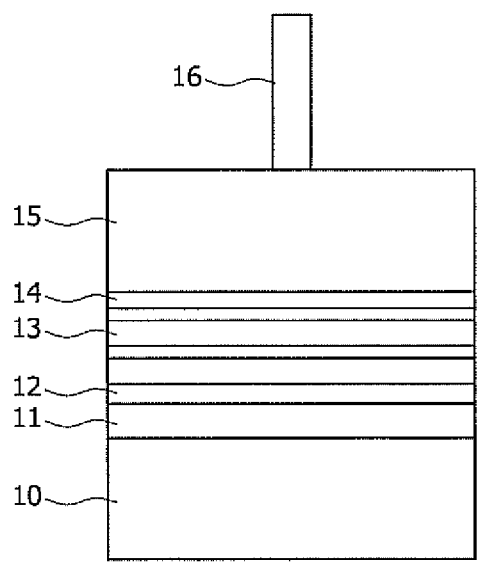

FIGS. 1A to 1B illustrate sectional views representing a method for fabricating a semiconductor device.

As shown in FIG. 1A, a titanium layer 11 and a tantalum layer 12 are formed on a substrate 10 in a semiconductor device. The titanium layer 11 and the tantalum layer 12 serve as a bottom electrode layer. A plurality of layers 13 constituting an MTJ element is formed on the tantalum layer 12. An MTJ element includes a ferromagnetic layer and an insulating layer that are stacked on the bottom electrode layer.

A capping layer 14 is formed on the plurality of layers 13 and a metal layer 15 is formed on the capping layer 14. A carbon layer 16 is formed on the metal layer 15 and an antireflective layer 17 is formed on the carbon layer 16. A photoresist pattern 18 is formed on the antireflective layer 17.

As shown in FIG. 1B, the carbon layer 16 is patterned by using the photoresist pattern 18 as an etching mask. During the patterning process, the photoresist pattern 18 is also removed. The metal layer 15 is patterned using the carbon pattern 16 as an etching mask. The metal pattern 15 serves as a hard masking layer. The plurality of layers 13 constituting an MTJ element is patterned using the metal pattern 15 as an etching mask and as a result, an MTJ is formed.

The manufacturing processes corresponding to FIGS. 1A and 1B are performed twice to complete manufacturing of an MTJ element in a semiconductor. For example, the processes are performed to form features in X axis direction and the processes are performed again to form features in Y axis direction crossing the X axis direction perpendicularly. For instance, the carbon layer 16 is patterned in X axis direction using the photoresist pattern 18 as an etching mask and the patterned carbon layer is further patterned in Y axis direction. The above-described patterning process of the carbon layer 16 forms a carbon pattern. Thus, two photoresist patterns are prepared and a patterning process for an MTJ element is performed twice as described above.

The metal layer 15 is to have a sufficient thickness so that the patterned metal 15 may also be used as an etching mask for patterning a bottom layer of an MTJ element. Since the patterned carbon layer 16 is used as an etching mask for the metal layer 15, the carbon layer 16 may have a minimum thickness of, for example, 4000 Å. However, it is difficult to pattern a carbon layer having a thick of 4000 Å even with advanced process equipments. The desirable size of the patterned carbon layer is desired to be small (for example, less than 30 nm). Even if the patterned carbon layer having a thick of 4000 Å is successfully completed, such a patterned carbon layer may easily collapse or slant due to its small size. If a stable patterned carbon layer is not reasonably obtained, the patterned metal layer is not obtained. Here, even an ArF-I light source that is widely used in a semiconductor process does not reliably produce a reliable patterned carbon layer. Thus, it has been difficult to produce a reliable patterned carbon layer that is used in an MTJ element.

Exemplary embodiments of the present invention are directed to a method for addressing the above-discussed features.

In accordance with an exemplary embodiment of the present invention, in order to prevent the collapse of minute patterns in an MTJ element, a carbon layer including a hole is first produced and a metal pattern is produced in the hole of the carbon layer. The metal pattern is used as an etching mask for patterning layers of an MTJ element. Since the patterning of the carbon layer is not necessary and the hole of the carbon layer is used to form the metal pattern, an MTJ element with the metal pattern is accurately formed.

FIGS. 2A to 2E illustrate sectional views representing a method for fabricating a semiconductor device in accordance with an embodiment of the present invention.

Figure 2A:
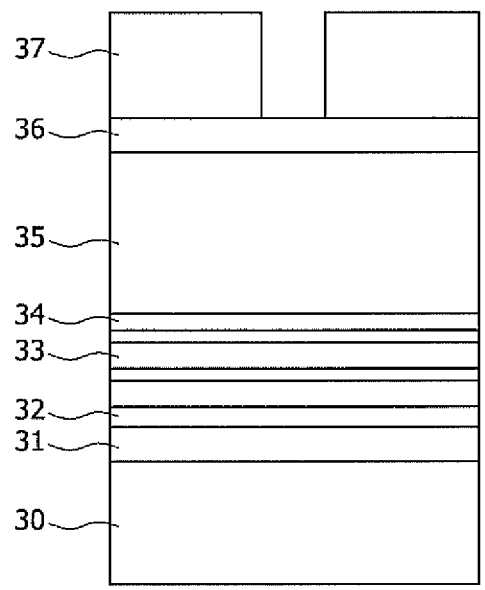
FIGS. 2A to 2E illustrate sectional views representing a method for fabricating a semiconductor device in accordance with an embodiment of the present invention.

As shown in FIG. 2A, in a manufacturing process of a semiconductor device in accordance with an exemplary embodiment of the present invention, a titanium layer 31 and a tantalum layer 32 are stacked on a substrate 30 of a semiconductor device. The titanium layer 31 and the tantalum layer 32 serve as a bottom electrode layer. A plurality of layers 33 constituting an MTJ element (e.g., stacked layers of ferromagnetic layers and insulating layers) are formed on the tantalum layer 32. An MTJ element includes at least one ferromagnetic layer and at least one insulating layer stacked on the bottom electrode layer.

The plurality of MTJ layers 33 constituting an MTJ element includes a pinned layer, a tunnel insulating layer, and a free layer. The MTJ element further includes a pinned layer, a free layer, and an insulating layer. The pinned layer has a polarity (i.e., magnetic direction) set to a fixed polarity. The free layer has a magnetic direction changed according to a direction of supplied current, where the supplied current is determined in response to data. The pinned layer may include a pinning plate and a pinned plate. According to an example, the MTJ ELEMENT includes electrodes.

The pinning plate, used for setting a polarity of the pinned plate to a fixed polarity, includes an antiferromagnetic material. For example, the antiferromagnetic material includes at least one of the following materials: IrMn, PtMn, MnO, MnS, MnTe, $MnF_2$, $FeF_2$, $FeCl_2$, FeO, $CoCl_2$, CoO, $NiCl_2$, and NiO. The pinning plate can be formed as either a single layer including one of the antiferromagnetic materials or laminated layers of different antiferromagnetic materials.

The pinned layer, having a fixed polarity set by the pinning plate, and the free layer each include a ferromagnetic material. For example, the ferromagnetic material includes at least one of the following materials: Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. Here, the pinned layer and the free layer may each be formed as either a single layer including one of the antiferromagnetic materials or laminated layers of different antiferromagnetic materials.

The pinned layer and the free layer may each include a laminated layer of ruthenium and one of the ferromagnetic materials, e.g., laminated layers of CdFe, Ru and CoFe. Further, the pinned layer and the free layer 33 may each include a synthetic antiferromagnetic (SAF) layer having a sequentially laminated structure of a ferromagnetic layer, an antiferromagnetic coupling spacer layer, and a ferromagnetic layer. The tunnel insulating layer is used as a tunneling barrier between the pinned layer and the free layer 33. The tunnel insulating layer may include any reasonably suitable material having an insulation characteristic. For example, the tunnel insulating layer may include a magnesium oxide layer (MgO).

A capping layer 34 is formed on the plurality of MTJ layers 33 for constituting an MTJ element, and a carbon layer 35 is formed on the capping layer 34. An antireflective layer 36 is formed on the carbon layer 35, and a photoresist pattern 37 is formed on the antireflective layer 36. The photoresist pattern 37 is formed as a line shape pattern. Here, the antireflective layer 36 includes SiON layer.

Figure 2B:
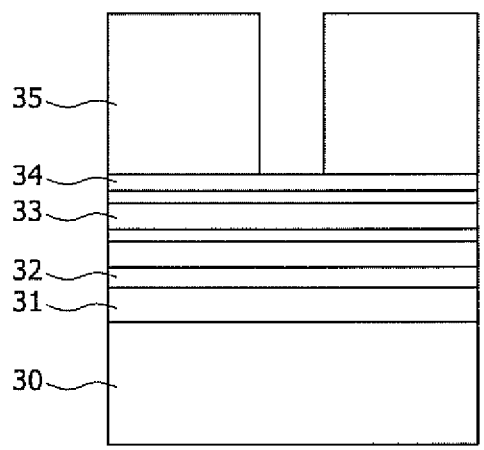

As shown in FIG. 2B, the carbon layer 35 is patterned to form a hole by using the photoresist pattern 37 as an etching mask. The shape of hole may be any reasonably suitable shape including a circle shape, an oval shape, a tetragon shape, a diamond shape, and a polygon shape. The capping layer 34 is used as an etching mask.

Figure 2C:
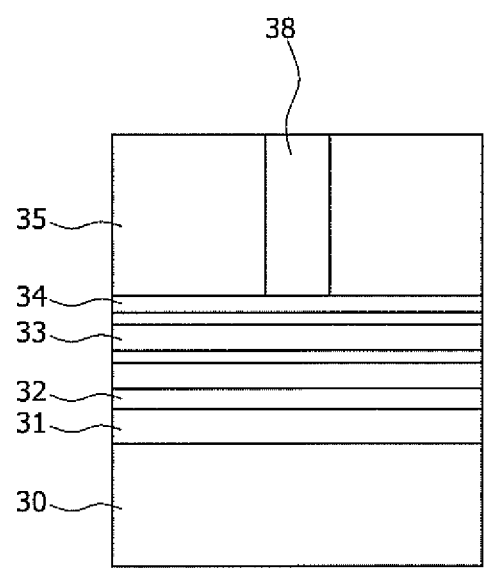

As shown in FIG. 2C, tantalum is filled in the hole shaped by the carbon layer 35 to make a tantalum pattern 38. Here, another metal may be used instead of tantalum. For instance, one or more layers of tantalum and tungsten or any reasonably suitable alloy including tantalum may be used. The process for filling in the hole may include an etch-back process or a chemical mechanical polishing process after filling the hole with metal, where the process may, for example, remove any excess metal outside the hole.

Figure 2D:
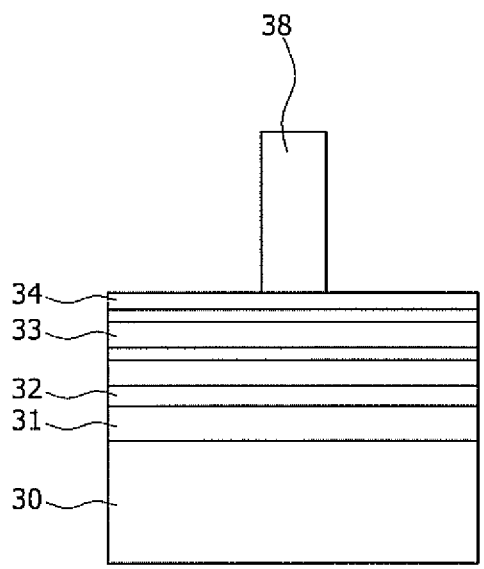

As shown in FIG. 2D, the carbon layer 35 around the hole is removed using a process gas including oxygen.

Figure 2E:
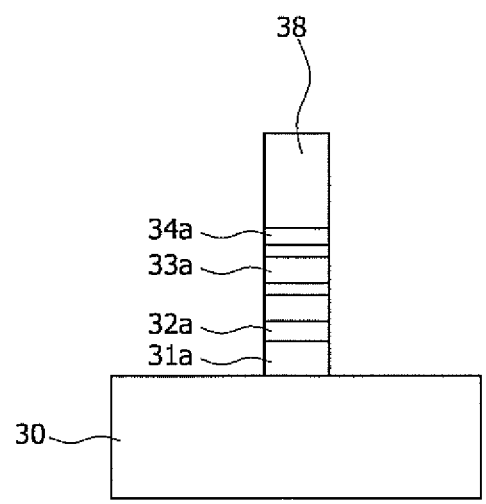

As shown in FIG. 2E, the plurality of MTJ layers 33 is patterned using the tantalum pattern 38 as an etching mask to make an MTJ element 33a. The tantalum layer 32 and the titanium layer 31 are also patterned using the tantalum pattern 38 as an etching mask to make a bottom electrode. During the process of patterning the MTJ layers 33 to produce the MTJ element 33a and the bottom electrode, the capping layer 34 is also patterned. Finally, the patterned capping layer 34a, an MTJ element 33a, the patterned tantalum layer 32a, and the patterned titanium layer 31a are formed as a stacked structure.

In accordance with an exemplary embodiment of the present invention, to prevent a collapse of a hard mask having a narrow width and a tall height, the patterned carbon layer including a hole is formed. Tantalum is filled in the hole to form a hard mask including the tantalum pattern 38. Here, tungsten may be used instead of tantalum. The hard mask is used to pattern the plurality of MTJ layers 33, the tantalum layer 32, and the titanium layer 31. Thus, a hard mask for patterning the plurality of layers for an MTJ element and a bottom electrode can be made to produce memory cells with good characteristics.

A semiconductor device including an MTJ element as a memory cell has been developed as an alternative to conventional semiconductor memory devices. For example, Spin Transfer Torque RAM devices may replace DRAM. Here, patterns for an MTJ element are to have a width of less than 30 nm and subsequently, a hard mask for implementing an MTJ element also have dimensions less than 30 nm. According to an exemplary embodiment of the present invention, patterns having a width of 30 nm can be easily and reliably formed.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a metal layer on a substrate;
   forming a plurality of layers of a magnetic tunnel junction (MTJ) element on the metal layer;
   forming a carbon layer including a hole, wherein the hole penetrates through the carbon layer;
   forming a metal pattern in the hole of the carbon layer;
   removing the carbon layer; and
   patterning a plurality of layers of the MTJ element using the metal pattern as an etching mask.

2. The method according to claim 1, wherein a shape of the hole includes one selected from a group of a circle shape, an oval shape, a tetragon shape, a diamond shape, and a polygon shape.

3. The method according to claim 1, further comprising patterning the metal layer using the metal pattern as an etching mask.

4. The method according to claim 1, wherein the metal pattern includes tantalum or an alloy having tantalum.

5. The method according to claim 1, wherein the metal layer includes stacked layers of a titanium-nitride layer and a tantalum layer formed on the titanium-nitride layer.

6. The method according to claim 1, further comprising forming a capping layer formed between the metal layer and the plurality of layers of the MTJ element, wherein the capping layer is used as an etch stopping layer when the hole of the carbon layer is formed.

7. The method according to claim 6, wherein the forming of the carbon layer including the hole includes:
   forming the carbon layer;
   forming a photoresist pattern having a shape matching the shape of the hole; and
   patterning the carbon layer using the photoresist pattern as an etching mask to form the hole.

8. The method according to claim 1, wherein the forming of the metal pattern includes filling the hole with a metal and performing a chemical mechanical polishing process on the metal.

9. A method for fabricating a semiconductor device, comprising:
   forming a magnetic tunnel junction (MTJ) element;
   forming a carbon layer over the MTJ element, wherein the carbon layer includes a hole and the hole penetrates through the carbon layer; and
   filling a metal in the hole.

10. The method according to claim 9, wherein the MTJ element includes a pinned layer, a free layer, and an insulating layer.

\* \* \* \* \*